United States Patent [19]
Rao

[11] Patent Number: 5,654,932
[45] Date of Patent: Aug. 5, 1997

[54] MEMORY DEVICES WITH SELECTABLE ACCESS TYPE AND METHODS USING THE SAME

[75] Inventor: G. R. Mohan Rao, Dallas, Tex.

[73] Assignee: Cirrus Logic, Inc., Fremont, Calif.

[21] Appl. No.: 538,903

[22] Filed: Oct. 4, 1995

[51] Int. Cl.⁶ .................................................... G11C 8/00
[52] U.S. Cl. ............................ 365/230.03; 365/230.06; 365/230.09
[58] Field of Search ..................... 365/230.03, 230.06, 365/230.09, 238.5, 189.02, 189.05, 189.12; 395/500

[56] References Cited

U.S. PATENT DOCUMENTS

| | | | |
|---|---|---|---|
| 4,422,160 | 12/1983 | Watanabe | 365/235 |
| 4,987,559 | 1/1991 | Miyauchi et al. | 365/189.04 |
| 5,161,221 | 11/1992 | Van Nostrand | 395/425 |
| 5,200,925 | 4/1993 | Morooka | 365/219 |
| 5,377,154 | 12/1994 | Takasugi | 365/221 |
| 5,381,367 | 1/1995 | Kajimoto | 365/230.09 |
| 5,410,680 | 4/1995 | Challa et al. | 395/500 |
| 5,455,795 | 10/1995 | Nakao et al. | 365/189.05 |
| 5,473,566 | 12/1995 | Rao | 365/189.12 |
| 5,497,351 | 3/1996 | Oowaki | 365/230.03 |
| 5,506,810 | 4/1996 | Runas | 365/230.03 |
| 5,528,552 | 6/1996 | Kamisaki | 365/230.03 |

Primary Examiner—David C. Nelms
Assistant Examiner—Trong Quang Phan
Attorney, Agent, or Firm—Winstead Sechrest & Minick, P.C.

[57] ABSTRACT

A memory 200 including an array 201 of rows and columns of memory cells. Row decoder circuitry 211 is provided for selecting in response to a row address a row in array 201 for access. Column decoder circuitry 205 is provided for selecting at least one location within a first group of columns along the selected row in array 201 in response to a column address. At least one shift register 207 is provided for allowing serial access to one of the cells within a second group of columns along the selected row.

32 Claims, 2 Drawing Sheets

MEMORY DEVICES WITH SELECTABLE ACCESS TYPE AND METHODS USING THE SAME

TECHNICAL FIELD OF THE INVENTION

The present invention relates in general to information processing circuits, devices and systems and in particular to memory devices with selectable access type and methods using the same.

BACKGROUND OF THE INVENTION

A typical processing system with video/graphics display capability includes a central processing unit (CPU), a display controller coupled to the CPU by a CPU local bus (directly and/or through core logic), a system memory coupled to the CPU local bus through core logic, a frame buffer memory coupled to the display controller via a peripheral local bus (e.g., PCI bus), peripheral circuitry (e.g., clock drivers and signal converters, display driver circuitry), and a display unit.

The CPU is the system master and generally provides overall system control in conjunction with the software operating system. Among other things, the CPU communicates with the system memory, holding instructions and data necessary for program execution, normally through core logic. Typically, the core logic is two to seven chips, with one or more chips being "address and system controller intensive" and one or more other chips being "data path intensive." The CPU also, in response to user commands and program instructions, controls the contents of the graphics images to be displayed on the display unit by the display controller.

The display controller, which may be, for example, a video graphics architecture (VGA) controller, generally interfaces the CPU and the display driver circuitry, manages the exchange of graphics and/or video data between the frame buffer and the CPU and the display during display data update and screen refresh operations, controls frame buffer memory operations, and performs additional basic processing on the subject graphics or video data. For example, the display controller may also include the capability of performing basic operations such as line draws and polygon fills. The display controller is for the most part a slave to the CPU.

In order to enhance system performance, it may be able to select the type of accesses (i.e. random, page or serial) to a given memory resource in order to optimize the execution of given processing operations. For example, graphics operations, such as line draws, often require a combination of both page mode and random accesses to the frame buffer and/or system memory. In contrast, during display refresh (which normally consumes 70% of the processing time of the display controller), a serial access may be the most efficient. In sum, because of the nature of instruction execution, certain types of memory accesses are better suited to the performance of certain processing operations.

However, access mode changes cannot be efficiently implemented with currently available memories devices and architectures. This is particularly true with regards to system memories, to which most of the real-time accesses are made during data processing. The typical system memory is constructed of single in-line memory modules (SIMMs). SIMMs normally include one or more dynamic random access memory devices (DRAMs) which are controlled by two clocks: a row address strobe (RAS) and a column address strobe (CAS). SIMMs operate only during one mode during a given RAS active cycle, normally the period when RAS is held at a logic low. Thus, the change from one mode to another, for example from random mode to page mode, requires a delay until the next active RAS cycle is initiated. Similar limitations are found with the use of single packaged DRAMs used to construct such memory resources as the display frame buffer.

In sum, no memory device is currently available in which given percentage of each RAS cycle may be used for random accesses, another percentage for page mode accesses and a further percentage for serial accesses. As discussed above, the ability to optimize processing operations by optimizing the type of memory access supporting those operations is highly advantageous. Thus, the need has arisen for circuits, systems and methods which allow for the efficient changing of modes in a memory device. In particular, such circuits, systems and methods should allow for multiple access modes to be utilized in a single RAS cycle.

SUMMARY OF THE INVENTION

In general, the principles of the present invention are to provide for the construction and operation of a memory in which a given percentage of an RAS active cycle can be used for random accesses, a second percentage can be used for page mode accesses, and a third percentage can be used for serial accesses. The memory includes an array of rows and columns of memory cells, such as an array of dynamic random access memory (DRAM) of cells. A first group of the column are associated with a column decoder which allows for either page mode or random accesses to the locations of an active row intersecting such first group of columns. A second group of columns in the array are associated with one or more shift registers. These shift registers allow serial accesses to the cells of the second group of columns at the intersection with the active row. The serial accesses may be performed substantially simultaneously with random and page mode accesses being made to the cells of the first group of columns through the column decoder circuitry.

According to one embodiment of the principles of the present invention, a memory is provided which includes rows and columns of memory cells and row decoder circuitry for selecting a row in the array for access. First column decoder circuitry is included for selecting a location within a first group of the columns along the selected row. Second column decoder circuitry is provided for selecting for access a location within a second group of columns along the selected row. Control circuitry is included for selectively performing an access of a selected type to a selected location of a selected one of the first and second group of columns through the first and second column circuitry.

According to a second embodiment of the principles of the present invention, a memory is provided including an array of rows and columns of memory cells. Row decoder circuitry selects a row in the array for access in response to a row address. Column decoder circuitry is provided for selecting at least one location within first group of columns along the selected row in the array in response to a column address. At least one shift register is included for providing serial access to ones of the cells within a second group of columns along the selected row.

According to a third embodiment of the principles of the present invention, a memory device is provided including an array of memory cells arranged in rows and columns. Means are provided for selecting a row in the array for access. Means are also provided for selectively performing random and page mode accesses to the cells of a selected row and first selected ones of the columns. Additionally, means are provided for selectively performing serial accesses to the cells of the selected row and second selected ones of the columns.

The principles of the present invention are also embodied in methods for accessing a memory array of rows and columns of memory cells, the columns of cells including a plurality of separately addressable groups. A row is selected in the array for access. A type of access is selected to be made to a first selected one of the groups of columns. The selected type of access is then performed to the first selected group of columns. A type of access is then selected to be made to a second selected one of the groups of columns. A type of access is selected and made to the second group of columns.

A second method is provided for accessing a memory including an array of rows and columns of memory cells, column decoder circuitry for selecting at least one location within a first group of columns, and at least one shift register for providing serial access to a second group of columns. A row in the array is selected for access. At least one address is provided to the column decoder to select at least one column of the first group for access. At least one corresponding cell along the selected row and the selected column of the first group is accessed, the access being of a type selected from a group consisting of random and page mode accesses. Further, data is serially accessed to at least one cell along the selected row corresponding to at least one column in the second group of columns.

The principles of the present invention have substantial advantages over the prior art. Among other things, these principles allow for the construction and operation of a memory device in which a given percentage of each RAS cycle may be used for random accesses, another percentage for page mode accesses and a further percentage for serial accesses. This allows processing operations to be optimized by optimizing the type of memory access supporting those operations. These memory devices are applicable in a wide number of applications, and in particular the construction and operation of personal computer systems and frame buffer memories. Advantageously, these principles may be applied to different types of memory, including dynamic random access memories and static random access memories.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
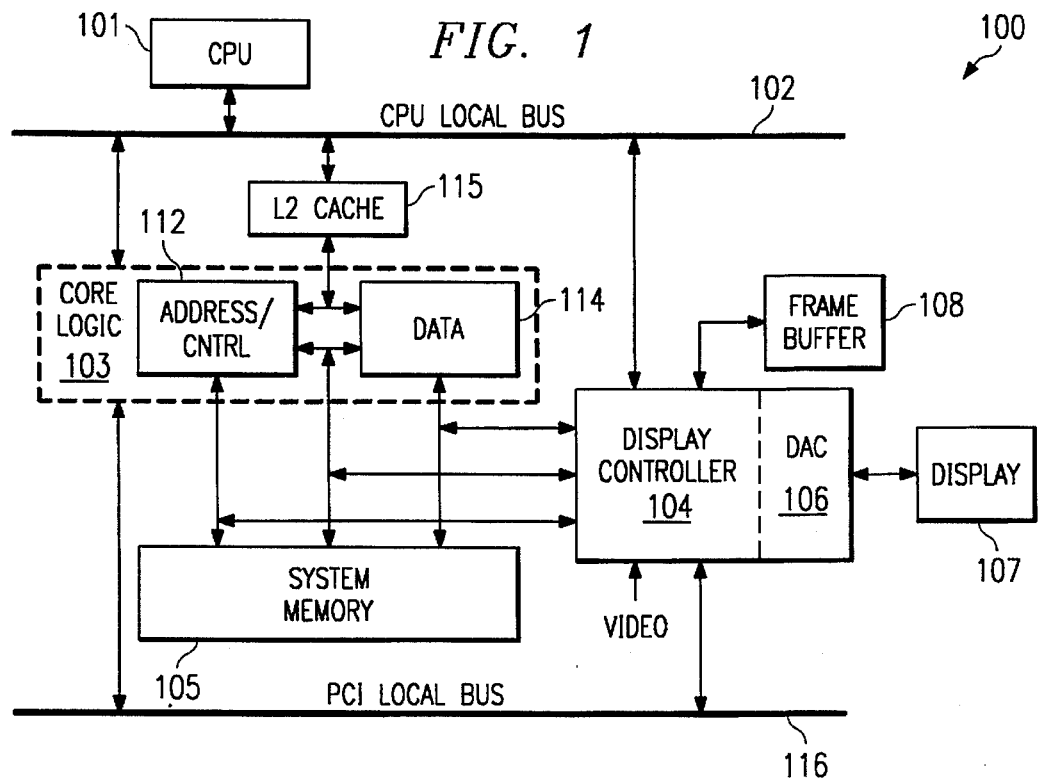
FIG. 1 is a functional block diagram of a typically information processing system in which one or more memories embodying the principles of the present invention may be employed.
Figure 3:
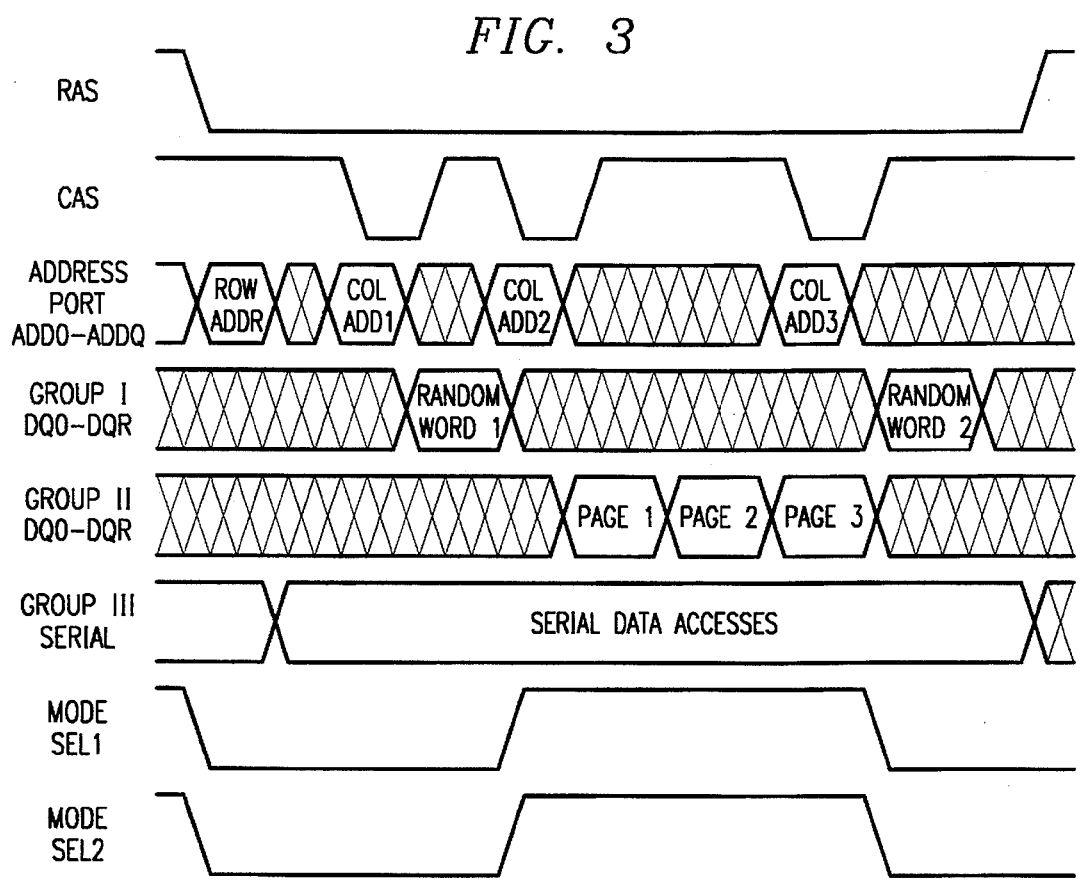
FIG. 3 is a timing diagram illustrating one possible method of operating the memory of FIG. 2.
Figure 2:
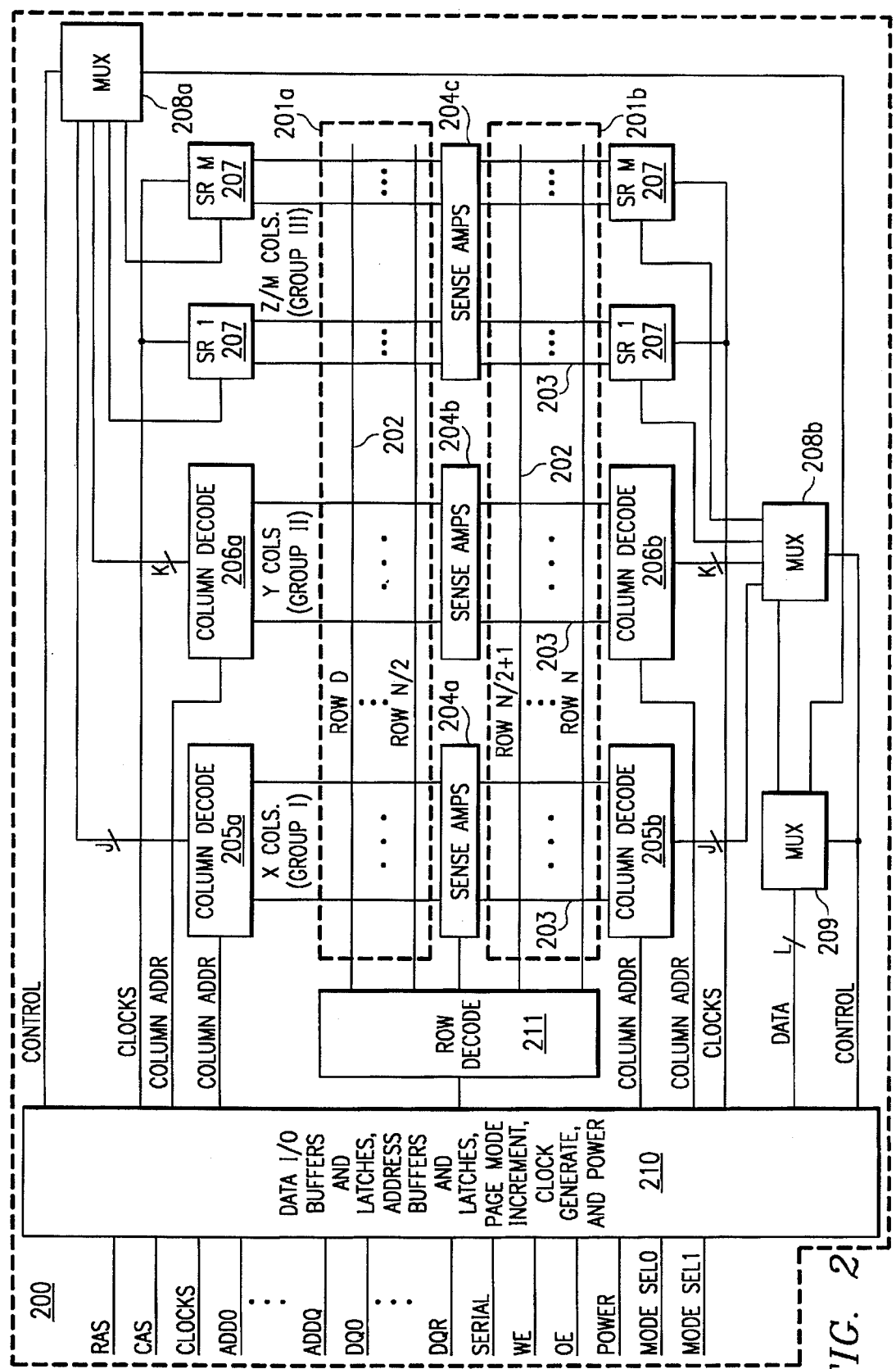
FIG. 2 is detailed functional block diagram of a memory device embodying the principles of the present invention.

The principles of the present invention and their advantages are best understood by referring to the illustrated embodiment depicted in FIGS. 1-3 of the drawings, in which like numbers designate like parts. While memory devices embodying the principles of the present invention are useful in a wide number of applications, for purposes of illustration, such memory devices will be described in conjunction with a basic processing system architecture typically employed in personal computers.

FIG. 1 is a high level functional block diagram of the portion of a processing system 100. System 100 includes a central processing unit 101, a CPU local bus 102, core logic 103, a display controller 104, a system memory 105, a digital to analog converter (DAC) 106, frame buffer 108 and a display device 107.

CPU 101 is the "master" which controls the overall operation of system 100. Among other things, CPU 101 performs various data processing functions and determines the content of the graphics data to be displayed on display unit 107 in response to user commands and/or the execution of application software. CPU 101 may be for example a general purpose microprocessor, such as an Intel Pentium class microprocessor or the like, used in commercial personal computers. CPU 101 communicates with the remainder of system 100 via CPU local bus 102, which may be for example a special bus, or a general bus (common in the industry).

Core logic 103, under the direction of CPU 101, controls the exchange of data, addresses, control signals and instructions between CPU 101, display controller 104, and system memory 105. Core logic 103 may be any one of a number of commercially available core logic chip sets designed for compatibility with the remainder of the system, and in particular with CPU 101. One or more core logic chips, such as chip 112 in the illustrated system, are typically "address and system controller intensive" while one or more core logic chips, such as chip 114 in FIG. 1, are "data intensive." Address intensive core logic chip 112 generally: interfaces CPU 101 with the address path of CPU bus 102; maintains cache memory, including the cache tags, set associative cache tags and other data necessary to insure cache coherency; performs cache "bus snooping"; generates the control signals required for DRAMs in the system memory or cache; and controls general management transactions. Data intensive chip 114 generally: interfaces CPU 101 with the data path of CPU bus 102; issues cycle completion responses to address chip 112 or CPU 101; may abort operations if their cycles are incomplete; and arbitrates for the data path of bus 102.

CPU 101 can directly communicate with core logic 103 or through an external (L2) cache 115. L2 cache 115 may be for example a 256 KByte fast SRAM device(s). It should be noted that CPU 101 can also include on-board (L1) cache, typically up to 16 kilobytes.

Display controller 104 may be any one of a number of commercially available VGA display controllers. Display controller 104 may receive data, instructions and/or addresses from CPU 101 either through core logic 103 or directly from CPU 101 through CPU local bus 102. Data, instructions, and addresses are exchanged between display controller 104 and system memory 105 through core logic 103. Further, addresses and instructions may be exchanged between core logic 103 and display controller 104 via a local bus which may be for example a PCI local bus. Generally, display controller 104 controls screen refresh, executes a limited number of graphics functions such as line draws, polygon fills, color space conversion, display data interpolation and zooming, and video streaming and handles other ministerial chores such as power management. Most importantly, display controller 104 controls the raster of pixel data from frame buffer 108 to display unit 107 during screen refresh and interfaces CPU 101 and frame buffer 108 during display data update. Video data may be directly input into display controller 104.

Digital to analog converter 106 receives digital data from controller 104 and outputs the analog data to drive display 107 in response. In the illustrated embodiment, DAC 106 is integrated with display controller 104 onto a single chip. Depending on the specific implementation of system 100, DAC 106 may also include a color palette, YUV to RGB format conversion circuitry, and/or X- and Y- zooming circuitry, to name a few options. Display 107 may be for example a CRT unit, a liquid crystal display, electroluminescent display, plasma display, or other type of display device which displays images on a screen as a plurality of pixels. It should also be noted that in alternate embodiments, "display" 107 may be another type of output device such as a laser printer or similar document view/print appliance.

The data paths in system 100 will vary with each design. For example, system 100 may be a "64-bit" or "72-bit" system. Assume for discussion purposes that a 64-bit system is chosen. Then, each of the data connections, including the data paths of CPU bus 102 and PCI bus 116, the data paths through core logic 103 to system memory 109 and display controller 104, and the data interconnection between display controller 104 and frame buffer 108, are all 64 bits wide. It should be noted that the address interconnections will vary depending on the size of the memory and such factors as the need to support data byte select, error detection correction, and virtual memory operations. In a typical CPU processor system today, the address portions of CPU bus 102 and PCI bus 116 are typically on the order of 30 bits wide.

FIG. 2 is a functional block diagram of a memory system 200 constructed in accordance with the principles of the present invention. Preferably, memory 200 is fabricated on a single chip, although the present invention is not limited to single chip embodiments. Typical applications of memory 200 include system memory 105 and frame buffer 108 of processing system 100, although memory 200 may be employed in any one of a number of processing system designs and architectures.

Memory 200 includes an array of memory cells 201, which in the illustrated embodiment of FIG. 2 is partition into two subarrays 201a and 201b. In the preferred embodiment, array 201 is constructed of dynamic random access memory (DRAM) cells; in alternate embodiments static random access memory (SRAM) or other types of data storage cells may be used.

In the illustrated embodiment, array 201 includes N number of rows of memory cells, with subarray 201a including rows 0 to N/2 and subarray 201b including rows N/2+1 to N. Each row of cells is associated with a conductive wordline 202. The columns of memory cells of array 201 are partitioned into three groups or banks of X number, Y number and Z number of columns respectively. Each column is associated with at least one conductive bitline 203. The bitlines 203 of each group of columns are coupled to a bank of sense amplifiers 204a–204c.

The first group (Group I) of X number of columns are coupled to column decoder circuitry 205; in the illustrated embodiment two column decoders 205a and 205b are used, with the cells of subarray 201a being coupled to column decoder 205a the cells of subarray 201b being coupled to column decoder 205b. In alternate embodiments a single column decoder 205 may be used which is coupled to corresponding outputs of source amplifiers. Column decoders 205 select a location of J number of cells along a selected row per access, where I is an integer greater than one and less than or equal to X.

Similarly, the second group of columns (Group II) are coupled to a sum column decoders 206a and 206b in the illustrated embodiment. Column decoders 206 select a location of K number of cells along a selected row per access, where K is an integer greater than one and less than or equal to Y.

The third group of Z number of columns are coupled to one or more shift registers 207. In the illustrated embodiment, M number of shift registers 207 are provided per subarray 201a or 201b with Z/M number of columns coupled to a corresponding shift register 207. Each shift register is operable to exchange (either read or write) data in parallel with the corresponding column lines 203 and input and output data as a single serial data stream. Multiple serial steams may be input or output from multiple shift registers 202 simultaneously or individually. Shifting can be accomplished using clocks generated internally or externally to memory 200. For example, in system 100, clocking may be through a system clock received from core logic 103 or a pixel clock timing display generation received from display controller 104.

The exchange of data to and from column decoders 205 and 206 and shift registers 207 is made through multiplexers 208a and 208b and 209. It should be recognized that in alternate embodiments the multiplexing of accesses to and from the Group I and Group II columns may be performed using column decoders 205 and 206 alone. In this case, multiplexers 208 would select between the corresponding shift registers 207 (if only one shift register 207 is employed per subarray 201, multiplexers 208a and 208b can be eliminated entirely). Further, in alternate embodiments where array 201 is not partitioned into subarrays, multiplexer 209 may also be eliminated.

Multiplexers 208 and 209 preferably select for access L number of cells, J or K parallel bits through a selected column decoder 205 or 206 from the active subarray 201 and one serial stream through a selected shift register 207, also coupled to the active array (i.e L=J or K+1). It should be recognized that the principles of the present invention are not limited to this particular configuration; for example, multiple parallel accesses of serial data may be accomplished using multiple parallel serial data lines and clocking multiple shift registers 207, simultaneously.

The "active" subarray 201 includes a row selected by conventional row decoder circuitry 211. Data and address input/output is implemented with I/O and control circuitry 210. Circuitry 210 includes conventional address and data I/O buffers, address latches, data read and write latches, and TTL to CMOS interface circuitry.

In the illustrated embodiment, a plurality of address pins ADD0 to ADDQ are provided for interfacing with a multiplexed bus; row address bits received and latched in with a row address strobe (RAS) and column address bits received and latched in with a column address strobe (CAS). In alternate embodiments, non-multiplexed address inputs may be used. Also in the illustrated embodiment, a data port is provided consisting of data pins DQ0 to DQR for accessing R parallel bits through column decoders 205 or 206 (preferably R is equal to the larger of J or K) along with one or more serial data pins (SERIAL) for accessing data through shift registers 207. Pins are also provided for the traditional DRAM control signals such as RAS, CAS, clocks, write enable (WE) and output (enable) Two pins are also provided for mode or "feature" select, which will be discussed further below.

I/O control circuitry also includes conventional page mode circuitry operable to internally generate column addresses to either column decoders 205, column decoders 206 or both to effectuate page mode accesses. Preferably, the initial column address to the initial page is latched in from and external source with the with CAS and the page mode circuitry increments from that address to generate addresses to successive pages, as is known in the art. Memory 200 may also be a synchronous DRAM operating under the timing of an externally generated master clock. I/O control circuitry 210 additionally provides for the traditional input and distribution of power (POWER).

According to the principles of the present invention, the cells of the Group I columns are preferably used for random accesses, the cells of the Group II columns are used for page mode accesses, and the cells of the Group III columns are used for serial accesses. It should be noted that random accesses may be made to the Group II columns and page mode accesses made to the Group I columns depending on the manner in which column addresses are presented to the column decoders 205 and 206.

An exemplary configuration of memory 200 is as follows. Array 201 includes 1024 rows (i.e N=1024), with 512 rows forming subarrays 201a and 201b, respectively. Group I is composed of 512 columns (X=512 and accesses through column decoders 205 are to 64-bit locations (i.e. J=64). Group II consists of 512 columns with accesses through column decoders 206 also to 64-bit locations (k=64). Group III consists of 512 columns with every subgroup of 64 columns coupled to a 64-shift register (i.e. M=64). In this configuration, L=65, representing 64 bits of parallel data from locations from the Groups I and II columns and 1 bit of serial data from the Group III columns. Numerous other configurations are possible depending on the requirements of the particular application.

The operation of memory 200 according to the principles of the present invention can now be described with reference to the exemplary timing diagram of FIG. 3. FIG. 3 depicts a single "RAS cycle" including representative random, page and serial accesses. During the operation of an actual physical embodiment of memory 200, the number and type of accesses will vary depending on the type of accesses required for a given application and such factors as the length of each active period of RAS.

The selection of the type of access and the group of columns being accessed is controlled in part by control signals presented at the Mode Select 0 (MODE SEL0) and Mode Select 1 (MODE SEL1) inputs. These signals are preferably dynamic such that the type of access and target group of columns can be changed "on-the-fly." In the illustrated embodiment, the decoding of the MODE SEL0 and MODE SEL1 pins are as follows:

| MODE SEL0 | MODE SEL1 | ACCESS TYPE |
| --- | --- | --- |
| 0 | 0 | Group I random. |
| 0 | 1 | Group I page. |
| 1 | 0 | Group II random. |
| 1 | 1 | Group II page. |

With the falling edge of RAS, a row address (ROW ADDR) is latched into the address latches of circuitry 210. Row decoder decodes this address and activates the word-line 202 of the selected row in array 201. With the falling edge of CAS, a first column address (COL ADD1) is latched into the address latches. In this example, for the first CAS cycle, MODE SEL0 and MODE SEL1 are both brought to a logic low and consequently the first access is a random access (RANDOM WORD1) to the Group I columns to a location corresponding to the latched-in column address. At the same time serial accesses can start being made through the serial pin (Serial) through the shift registers corresponding to the subarray 201 encompassing the selected row. Serial accesses (Serial Data Access) can start as soon as the row address has been latched-in and decoded. Word selection (i.e word position along the selected row) for each serial access is accomplished by selectively starting and stopping the shift clock to the corresponding shift registers 207 in the desired order.

In the example of FIG. 3, MODE SEL1 and MODE SEL0 are next both brought to a logic high in order implement a page mode access to the Group II columns. A second column address (COL ADD2) is received and latched into the address latches of circuitry 210 with the following edge of a second active cycle of CAS. This column address addresses the first location in the Group II columns to be paged out, in this case Page 1 (PAGE 1). Column addresses for subsequent pages to the Group II columns are generated by incrementing from the second received column address using the conventional page mode circuitry within circuitry 210. In the example of FIG. 3, three locations are paged out as Pages 1–3 (PAGE 1, PAGE 2, PAGE 3), although in alternate embodiments this number may differ depending on when the next random cycle (if any) is required and when RAS must return high (inactive) to start the next precharge cycle (in the case of a DRAM embodiment).

In the example RAS cycle of FIG. 3, a second random access (RANDOM WORD 2) is next made to the Group I columns. A third column address is received and latched into the address latches of circuitry 210 with the falling edge of a third CAS active cycle. The control signals received at MODE SEL0 and MODE SEL1 both transition to a logic low state.

The entire RAS cycle ends with the end of the RAS active period as defined by the rising edge of RAS. Memory 200 now enters precharge. A new RAS cycle will begin with the next falling edge of RAS following precharge and the next row address to select the next row for access. A combination of page mode, random and serial accesses can then be performed to the new row, as needed to meet system operating requirements.

Although the present invention and its advantages have been described in detail, it should be understood that various changes, substitutions and alterations can be made herein without departing from the spirit and scope of the invention as defined by the appended claims.

What is claimed is:

1. A memory comprising:

an array of rows and columns of memory cells;

row decoder circuitry for selecting a said row in said array for access;

first column decoder circuitry for selecting a location within a first group of said columns along said selected row;

second column decoder circuitry for selecting for access a location within a second group of said columns along said selected row; and control circuitry operable during a selected random cycle to initiate a page access through a selected one of said first and second column decoder circuitry and a random access through another one of said first and second column decoder circuitry.

2. The memory of claim 1 wherein said selected type of access is selected from the group consisting of random and page mode accesses.

3. The memory of claim 1 wherein said control circuitry selects a said group for access and said type of access to be performed in response to at least one control signal.

4. A memory comprising:

an array of rows and columns of memory cells;

row decoder circuitry for selecting a selected row in said array for access;

first column decoder circuitry for selecting a location within a first group of said columns along said selected row in;

second column decoder circuitry for selecting for access a location within a second group of said columns along said selected row;

control circuitry for selectively performing an access of a selected type to a selected said location of a selected one said first and second groups of columns through said first and second column decoder circuitry; and at least one shift register coupled to a third group of said columns for providing serial access to cells within said third group of columns along said selected row.

5. The memory of claim 4 wherein said at least one shift register comprises a plurality of shift registers.

6. The memory of claim 1 wherein said array of cells comprises an array of dynamic random access memory cells.

7. The memory of claim 1 wherein said array of cells comprises an array of static random access memory cells.

8. A memory comprising:

an array of rows and columns of memory cells, said array of cells comprising first and second subarrays each comprising selected ones of said rows;

row decoder circuitry for selecting a selected row in said array for access;

first column decoder circuitry for selecting a location within a first group of said columns along said selected row in;

second column decoder circuitry for selecting for access a location within a second group of said columns along said selected row; and control circuitry for selectively performing an access of a selected type to a selected said location of a selected one said first and second groups of columns through said first and second column decoder circuitry.

9. The memory of claim 8 wherein said first column decoder circuitry comprises first and second column decoders coupled to bitlines of said first group of columns, said first column decoder for addressing locations in said first subarray and said second column decoder for addressing locations in said second subarray.

10. The memory of claim 8 wherein said second column decoder circuitry comprises first and second column decoders coupled to bitlines of said second group of columns, said first column decoder for addressing locations in said first subarray and said second column decoder for addressing locations in said second subarray.

11. The memory of claim 4 wherein said 4 wherein said at least one shift register is clocked by a clock signal received from a source external to said memory.

12. A memory comprising:

an array of rows and columns of memory cells;

row decoder circuitry for selecting in response to a row address a row in said array for access;

column decoder circuitry for selecting at least one location within a first group of columns along said selected row in said array in response to a column address; and at least one shift register for providing serial access to ones of said cells within a second group of columns along said selected row.

13. The memory of claim 12 and further comprising page mode control circuitry for generating a plurality of column addresses, said plurality of addresses presented to said column decoder circuitry to access a plurality of pages along said selected row.

14. The memory of claim 12 and further comprising input/output circuitry for controlling the exchange of data between said column decoder and said shift register and associated input/output pins.

15. The memory of claim 14 wherein said input/output circuitry is operable to allow an access to said first group of columns through said column decoder circuitry and simultaneously serial accesses to said second group of columns through said at least one shift register.

16. The memory of claim 12 wherein said at least one shift register comprises a plurality of shift registers and said memory further comprises multiplexing circuitry for selecting a said shift register for accessing corresponding ones of said second group of columns.

17. The memory of claim 12 wherein said array of memory cells comprises first and second subarrays, a first group of said rows forming said first subarray and a second group of said rows forming said second subarray.

18. The memory of claim 17 and further comprising a plurality of sense amplifiers coupled to bitlines of said first group of columns and shared by said first and second subarrays.

19. The memory of claim 18 wherein said column decoder circuitry comprises a first column decoder coupled to said bitlines of said first group of columns and associated with said first subarray and a second column decoder coupled to said bitlines of said first group of columns and associated with said second subarray.

20. The memory of claim 12 and further comprising second column decoder circuitry for selecting at least one location within a third group of said columns.

21. The memory of claim 20 and further comprising control circuitry for selectively performing an access of a selected type to a selected location within selected one of said first and third groups of columns through said respective first and second column decoder circuitry.

22. The memory of claim 21 wherein said selected access type is selected from the group consisting of random and page mode accesses.

23. The memory of claim 21 wherein said control circuitry is further operable to provide for a serial access through said at least one shift register simultaneous with a said selected access to said selected one of said first and third groups of columns.

24. A processing system comprising:
a central processing unit;
a bus coupled to said central processing unit;
core logic coupled to said bus; and
a memory coupled to said core logic comprising:
an array of memory cells arranged in rows and columns;
means for selecting a selected row in said array for access;
means for selectively performing random and page mode accesses to said cells of said selected row and first selected ones of said columns; and
means for selectively performing serial accesses to cells of said selected row and second selected ones of said columns.

25. The system of claim 24 wherein said circuitry for performing serial accesses is operable to perform serial accesses to said second selected ones of said columns substantially simultaneous with said circuitry for selectively performing random and page mode accesses performing at least one access to said first selected ones of said columns.

26. The system of claim 25 wherein memory comprises at least a portion of a system memory.

27. The system of claim 25 wherein said memory comprises at least a portion of a frame buffer memory coupled to said core logic through a display controller.

28. A method of performing different accesses during a single RAS cycle to a memory array of rows and columns of memory cells, the columns of cells including a plurality of separately addressable groups, the method comprising the steps of:
selecting a row in the array for access;
selecting a first type of access to be made to a first selected one of the groups of columns;
performing the selected type of access to the first selected group of columns;
selecting a second type of access to be made to a second selected one of the groups of columns, the second type of access differing from the first type of access; and
performing the selected type of access to the second selected group of columns.

29. The method of claim 28 wherein said steps of selecting a type of access comprise the steps of selecting a type of access from the group consisting of random and page mode accesses.

30. The method of Column 28 wherein said steps of performing are performed substantially simultaneously.

31. A method of performing multiple types of accesses during a single RAS cycle to a memory including an array of rows and columns of memory cells, column decoder circuitry for selecting at least one location within a first group of columns, and at least one shift register for providing serial access to a second group of columns, the method comprising the steps of:
selecting a row in the array for access;
providing at least one address to the column decoder to select at least one column of the first group for access;
accessing at least one corresponding cell along the selected row and the selected column of the first group, the access of a type selected from random and page mode accesses; and
serially accessing data to at least one cell along the selected row corresponding to at least one column in the second group.

32. The method of claim 31 wherein said step of accessing and said step of serially accessing are performed substantially simultaneously.

* * * * *